United States Patent [19]

Tanabe et al.

[11] Patent Number: 4,510,517

[45] Date of Patent: Apr. 9, 1985

[54] ELECTRONICALLY CONTROLLED VARIABLE SEMICONDUCTOR RESISTOR

[75] Inventors: Kenzo Tanabe, Katano; Keiichiro Shimizu, Kyoto, both of Japan

[73] Assignee: Matsushita Electric Industrial Co., Ltd., Osaka, Japan

[21] Appl. No.: 449,732

[22] Filed: Dec. 14, 1982

[30] Foreign Application Priority Data

Dec. 15, 1981 [JP] Japan .............................. 56-202713

[51] Int. Cl.³ .......................................... H01L 29/72
[52] U.S. Cl. ...................................... 357/34; 357/51; 357/36; 357/68
[58] Field of Search ...................... 357/34, 36, 51, 68

[56] References Cited

U.S. PATENT DOCUMENTS 3,979,769  9/1976  Houston et al. ................. 357/34 X
4,223,335  9/1980  Kane ................................ 357/34 X
4,228,450  10/1980 Anantha et al. .................. 357/34 X

FOREIGN PATENT DOCUMENTS

WO83/02369  7/1983  PCT Int'l Appl. ................... 357/34

Primary Examiner—Andrew J. James
Assistant Examiner—William A. Mintel
Attorney, Agent, or Firm—Wenderoth, Lind & Ponack

[57] ABSTRACT

An electronically controlled variable semiconductor resistor having a three layer construction of either an NPN-type or a PNP-type which is similar to that of a bipolar transistor and basically using the base region and collector region of the transistor as a variable resistor having its resistance value controlled by varying its emitter current. The conductivity of the base region adjoining the emitter region and that of the collector region opposite the emitter region across the base region are modulated largely by minority carriers injected into the base region from the emitter. The carrier density at each emitter, base or collector region is reasonably controlled so as to thereby make it possible to obtain a variable resistor whose resistance value changes about in an inverse proportion to the emitter current and the electrode of proper construction is designed to allow the control signal component for controlling the emitter current not to appear at both ends of the resistor electrode at the resistor.

7 Claims, 7 Drawing Figures

ELECTRONICALLY CONTROLLED VARIABLE SEMICONDUCTOR RESISTOR

BACKGROUND OF THE INVENTION

1. Field of the Invention

This invention relates to an electronically controlled variable semiconductor resistor, and more particularly to an electronically controlled variable semiconductor resistor facilitating multiplication processing of an analog signal, i.e., modulation, demodulation and frequency conversion of the analog signal.

2. Description of the Prior Art

Conventionally, a bipolar transistor or a field effect transistor, is used for a semiconductor variable resistance element used for processing an analog signal, and such a transistor is characterized in that the impedance between the collector and the emitter or between the drain and the source of the transistor changes by a base current or voltage between the gate and the source, and is often used as a variable attenuator.

However, between the aforesaid variable impedance (herein, the impedance between the collector and the emitter or between the drain and the source) and a control signal (herein, the base current or voltage between the gate and the source), there is no relationship with respect to the intensity which is given by an equation, whereby the aforesaid transistors are not suitable for a multiplication processing element for use with an analog signal.

SUMMARY OF THE INVENTION

An object of this invention is to provide an electronically controlled variable semiconductor resistor whose resistance value is inversely proportional to a control signal by allowing the resistance of the base region thereof to vary in an inverse proportion to an emitter current thereof.

Another object of this invention is to provide an electronically controlled variable semiconductor resistor whose resistance value is inversely proportional to a control signal by allowing the resistance value of the collector region thereof to vary in an inverse proportion to an emitter current thereof.

Still another object of this invention is to provide an electronically controlled variable semiconductor resistor which has a superior multiplication characteristic so as to be applicable to a signal multiplication circuit such as a mixer and a modulator.

The above and other objects and features of this invention will become more apparent from the following description taken in consideration with the accompanying drawings in which:

DESCRIPTION OF THE PREFERRED EMBODIMENTS

Figure 1:
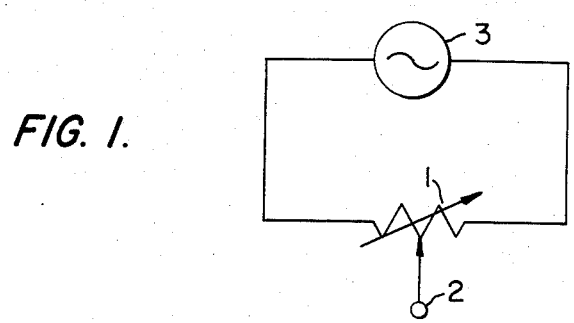
FIG. 1 is a schematic circuit diagram explanatory of the multiplication process for analog signals.

FIG. 1 is a schematic view explanatory of the characteristic of the variable resistor available for the analog signal multiplying process, in which it is assumed that a variable resistor 1 has its resistance value R controlled by a control voltage $V_c$ (or a control current $I_c$) applied from a terminal 2. Since the variable resistor 1 is supplied with signal voltage Vs by a separate signal source 3, a current is flowing in the variable resistor 1 as expressed by $V_s/R$. Here, the resistance value R of the variable resistor 1 is assumed to be inversely proportional to the control voltage Vc (or control current $I_c$), the current Is being proportional to the product of $V_s$ and $V_c$ (or $I_c$).

Next, an embodiment of the invention will be described in accordance with the drawings.

Figure 2:
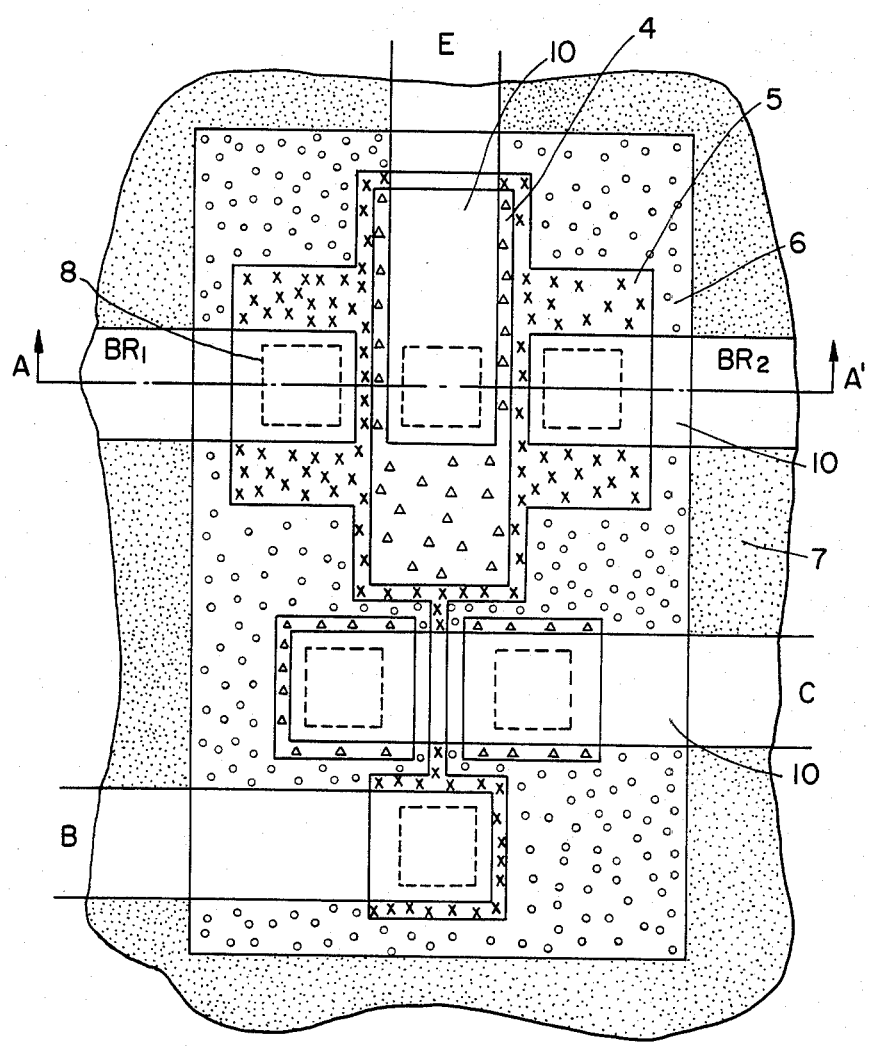
FIG. 2 is a plan view of an embodiment of an electronically controlled variable semiconductor resistor of the present invention.
Figure 3:
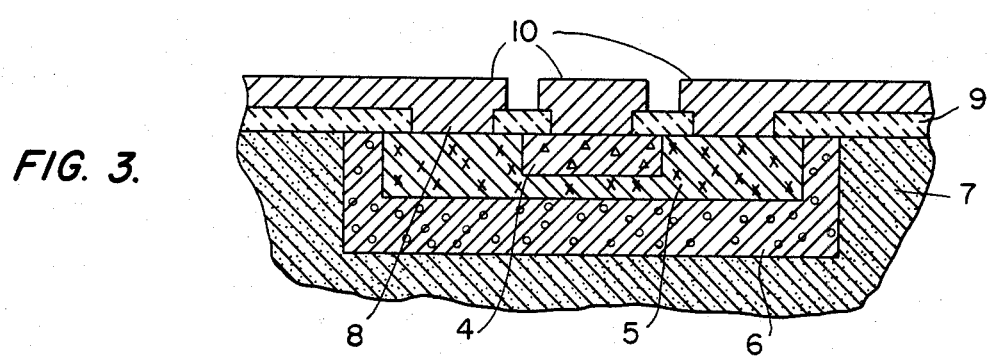
FIG. 3 is a sectional view taken on a line A—A' in FIG. 2.

FIG. 2 a top plan view of an element when the invention is applied to the bipolar process, that is, the so-called composite mask drawing, and FIG. 3 is a sectional view taken on the line A—A' in FIG. 2.

In FIG. 2, the region 4 which is marked by Δ's represents an N-type emitter diffusion layer (emitter region); the region 5 which is marked by X's represents a P-type base diffusion layer (base region); the region 6 which is marked by O's represents an N-type epitaxial layer (collector region); the region 7 which is surrounded by the dots represents a P-type diffusion isolation layer; the region 8 which is surrounded by the broken line represents a window through an oxide insulator 9 provided on the surface of a semiconductor for connecting the semiconductor and aluminum wiring; a blank region 10 which is surrounded by the solid line represents the aluminum wiring layer; reference designations E, B and C respectively represent the emitter, base and collector electrodes, and designations $BR_1$ and $BR_2$ represent resistor electrodes when used as the variable resistors.

In FIG. 3, regions 4, 5 and 6 represented by marks Δ, x, and O are respectively the same as those in FIG. 2; the dotted region 7 represents a P-type substrate portion; the hatched region represents an aluminum wiring layer 10, and the region shaded by thin vertical lines represents an oxide insulator layer 9.

Next, the operating principle of the present invention will be explained according to FIG. 3.

In the present invention, the carrier density of the emitter region 4, which is the same as that of the usual bipolar transistor, is made far higher than that of base region 5 and a forward bias voltage is applied between the emitter and the base so that minority carriers which are proportional to the emitter current are injected into the base region 5 just below the emitter, the injected carriers being diffused mainly toward the region below the collector-base junction, and, when the collector-base junction has either a zero bias or reverse bias applied, the carriers reach the collector region 6 through the junction. Here, when the distance between the emitter-base junction located just below the emitter and the collector-base junction located just below the emitter-base junction, the so-called base width, is kept sufficiently smaller than a diffusion length of the minority carriers injected into the base which is the same as in the conventional bipolar transistor, the minority carriers scarcely disappear in the base region 5 so as to reach the collector region 6.

The carrier density of the emitter region 4, as mentioned above, is made much higher than that of the base region 5; in other words, the base width is sufficiently reduced, and the collector-base junction is kept at either a zero bias or a reverse bias, whereby the base region 5 located just below the emitter region can be occupied by most the minority carriers injected from the emitter region 4, and almost all of the carriers can be kept from disappearing within the base region 5 located just below the emitter.

The base region 5 containing such minority carriers will increase its electrical conductivity in proportion to the quantity of carriers.

The quantity of minority carriers, located within the base region located just below the emitter region, decreases its density distribution from the emitter-base junction toward the collector-base junction, but the quantity of minority carriers existing in the overall base region 5 is proportional to the emitter current throughout its wire range (in the range of no lowering of its injection efficiency).

Therefore, the electric conductivity of base region 5 located just below the emitter becomes changeable in proportion to the emitter current; in other words, the resistance of base region 5 decreases in an inverse proportion to the emitter current.

A first object of the invention is to provide a variable resistor which utilizes a variation of the resistance of base region 5 which is inversely proportional to the emitter current to thereby obtain a variable resistor having a resistance value which is inversely proportional to its control signal.

It is desirable for attaining the above-noted purpose to eliminate to the utmost, various parasitic elements present during the practical use of the variable resistor and to prevent the control signal component from appearing between the electrodes $BR_1$ and $BR_2$ used for the variable resistor.

FIG. 2 shows an embodiment of the pattern obtained in consideration of the above-noted matter.

As in detail, in FIG. 2, the electrodes $BR_1$ and $BR_2$ for the resistor and a resistance region formed of the base diffusion region 5 which is not covered by the emitter region 4, are undesirable parasitic elements, the resistance region being arranged in parallel to a variable resistor region formed of the base region 5 located just below the emitter region.

A resistance region from the boundary of base region 5 located just below the emitter region 4 to the electrodes $BR_1$ and $BR_2$ forms a resistor, and is also an undesirable parasitic element, the resistance region being arranged in series with the variable resistor region formed of the base region 5 located just below the emitter region 4.

Next, some explanation will be given on a concrete means to avoid the influences of parasitic elements as much as possible. In other words, an effective approach is for the parasitic resistive element in series to be designed with a pattern arranged such that its resistance value is decreased to the utmost, or arranged such that the carrier density of the peripheral base region 5 including the electrodes $BR_1$ and $BR_2$ for resistive elements is to be made high. Also, an effective approach is for the parasitic resistive element in parallel to be designed with a pattern arranged such that the width of the base region 5 not covered by the emitter region 4 is designed to be reduced to the utmost so as to increase the resistance value and increase the length thereof.

In order to avoid the appearance of the control signal component between the electrodes $BR_1$ and $BR_2$, it is desirous to arrange the emitter, base and collector electrodes E, B, and C, for example as shown in FIG. 2, symmetrically with respect to the electrodes $BR_1$ and $BR_2$. It is also important to design a pattern in which the impedance of the region between the base electrode B and the base region 5 located just below the emitter which is used as the variable resistor, is made higher, thereby enabling it to not be significantly affected by the impedance of a control signal source connected to the base electrodes.

Next, an embodiment of a frequency mixer or frequency converter supplied with the variable resistor of the present invention will be described in accordance with the drawings.

Figure 4:
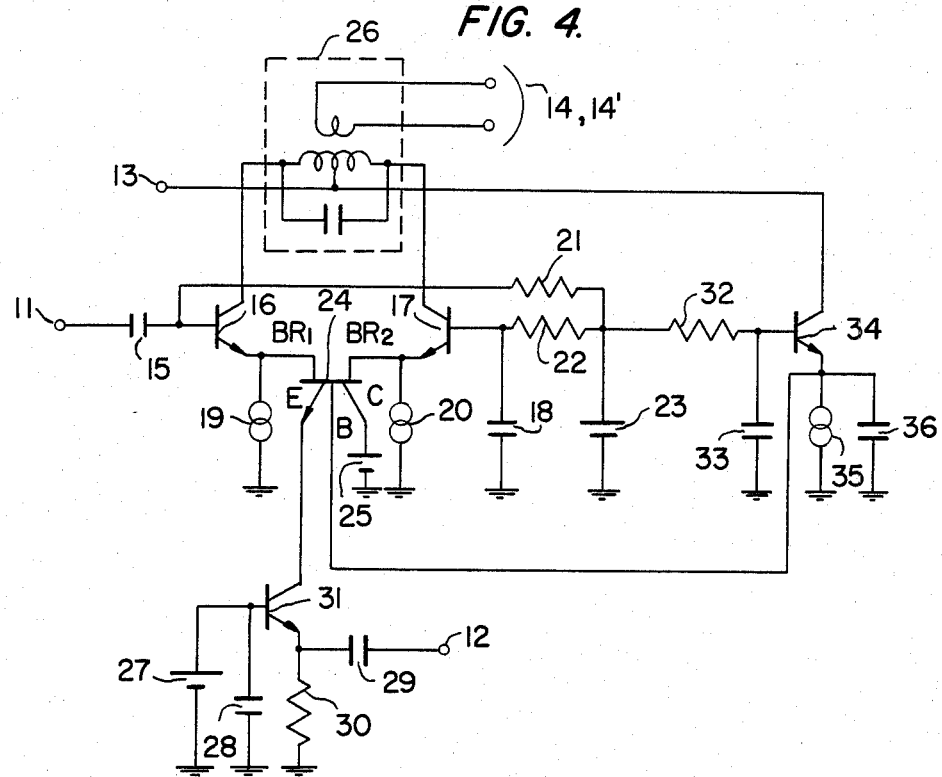
FIG. 4 is a circuit diagram of an embodiment of a frequency mixer using an electronically controlled variable semiconductor resistor of the present invention.

FIG. 4 is a circuit diagram of a frequency mixer of the embodiment of the present invention, in which an input signal fed to a terminal 11 is fed through a coupling capacitor to a differential amplifier composed mainly of transistors 16 and 17, the variable resistor 24 detailed in FIGS. 2 and 3, and an intermediate frequency transformer 26.

Constant current sources 19 and 20 (realizable by a current mirror circuit), base bias resistances 21 and 22, and a DC power source 23, constitute a bias circuit by which a suitable operation bias is provided to the above-noted differential amplifier, and a separate DC power source is connected to a terminal 13, a by-pass capacitor 18 serving to lower the base impedance of transistor 17.

The electrodes $BR_1$ and $BR_2$ of the aforesaid variable resistor 24 are respectively connected to the emitters of transistors 16 and 17, and used as the emitter impedance in common to the differential amplifier, and the base electrode B and the emitter electrode E of the resistor 24 are respectively connected to a DC power source 25, the emitter of a bias transistor 34, and the collector of a local oscillator signal injecting transistor 31. The transistor 34 is given a suitable operation bias by a base bias resistance 32, a constant current source 35, and the DC source connected to the terminal 13, which is used for equalizing the DC potential of the base electrode B of the variable resistor 24 so as to be equal to that of electrodes $BR_1$ and $BR_2$ of the resistance elements, which are thereby provided so as to not produce an unnecessary DC voltage difference in the base diffusion layer shown in FIG. 1. For this purpose, it is of course desirable to allow the base bias resistances 21, 22, and 32, constant current sources 19, 20 and 35, and transistors 16, 17 and 34, to have the same characteristics.

In addition, capacitors 33 and 36 are for the base and emitter by-pass.

The transistor 31 serves to convert to a constant current the local oscillator signal provided to the emitter through the terminal 12 and coupling capacitor 29, the DC source 27 and emitter resistance 30 serving to give a suitable operation bias to the transistor 31, the capacitor 28 being for the base by-pass.

Next, explanation will be given on the operation principle of the circuit.

A resistance value $R_x$ between the electrodes $BR_1$ and $BR_2$ of the resistor 24, as detailed in FIGS. 2 and 3, is inversely proportional to the emitter current $I_E$ and given approximately by the following equation:

$$R_x = K/I_E \quad (1).$$

The collector current of the transistor 31, i.e., the emitter current $I_E$ of the variable resistor 24 is assumed to be given by the following equation:

$$I_E = I_o + i_2 \quad (2)$$

where $I_o$: DC bias current and $i_2$: local oscillator signal current.

Next, when the primary impedance of intermediate frequency transformer 26 is represented by Z and a turns ratio of the primary and secondary coils by N, an intermediate frequency signal obtained from secondary output terminals 14 and 14' is given approximately by the following equation $$e_{IF} = (Z \cdot N/R_x)e_i \quad (3).$$

where $e_i$: input signal. Hence, $e_{IF}$ is given by the equations (1), (2), and (3) as follows:

$$e_{IF} = (Z \cdot N/K)(I_o + i_2)e_i \quad (4).$$

In the equation (4), $i_2$ and $e_i$ are assumed to be sinusoidal signals, the components $i_2$ and $e_i$ included in the equation (4) represent the intermediate frequency signal components, from which it is understood that this circuit performs as a frequency mixer.

In addition, in the equation (4), at the output terminals 14 and 14' is found a component which is proportional to an input signal other than the intermediate frequency signal, but the intermediate frequency transformer 26 essentially is adjusted to have a frequency selective characteristic so as to resonate with the intermediate frequency, whereby the output terminals 14 and 14' output almost only the intermediate frequency signal component.

Figure 5:
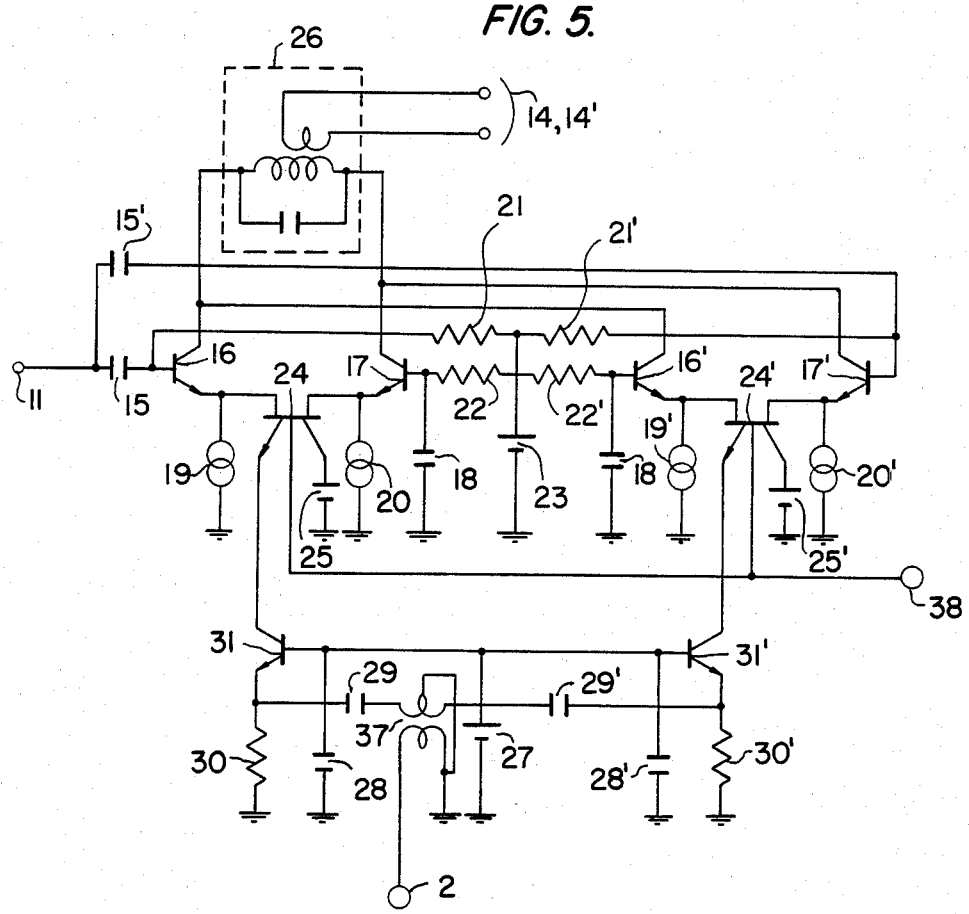
FIG. 5 is a circuit diagram of another embodiment of a frequency mixer using an electronically controlled variable semiconductor resistor of the invention.

FIG. 5 is a circuit diagram of a modified embodiment of the invention, which is a balanced type frequency mixer utilizing the variable resistor comprising two sets of the FIG. 4 circuit which are connected in a complementary fashion so as to cancel the input signal components at their output.

In FIG. 5, the components which are the same as those in FIG. 4 are designated by the same reference numerals and those with prime symbols, and a transformer 37 provides local oscillator signals to transistors 31 snd 31' which are of opposite polarity, and a terminal 38 is a power supply terminal for the base bias of the variable resistor, which is connected to, for example the emitter of transistor 34 in FIG. 4.

In the FIG. 5 circuit, the same operation as a transistor double-balanced mixer cancels the input signal components at the output and only the intermediate frequency signal components are added, but the principle of the input signal cancellation in a double-balanced mixer is well-known so as to not require further description.

One way of fabricating the variable resistor is by using the conductivity modulation of the base region and its application, but the basic concept of the invention is easy to expand with respect to the conductivity modulation of collector region as well as the conductivity modulation of the base region. Hence, a second object of the invention is to provide a variable resistor whose resistance value is inversely proportional to the control signal, by utilizing the fact that the resistance of the collector region adjoining the base region opposite the emitter region changes in proportion to the emitter current.

Next, a further modified embodiment will be described according to the drawings.

Figure 6:
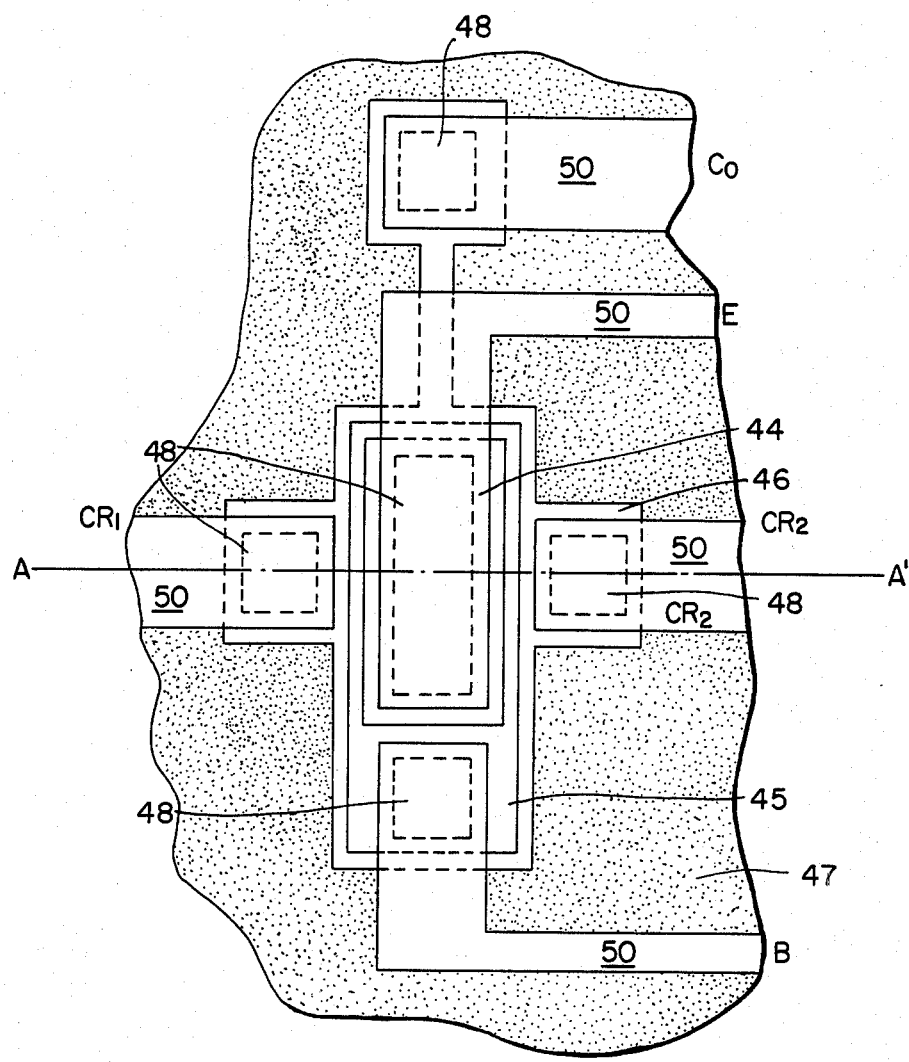
FIG. 6 is a plan view of another embodiment of an electronically controlled variable semiconductor resistor of the present invention.

FIG. 6 is a plan view of the variable resistor whose bipolar IC process is applied to the present invention, when viewed from above, that is, the composite mask pattern.

In FIG. 6, reference numeral 44 designates an N-type emitter diffusion layer (emitter region); numeral 45 designates a P-type base diffusion layer (base region); numeral 46 designates an N-type collector epitaxial layer (collector region); numeral 47 designates a P-type diffusion isolation layer or a dielectric isolation layer; numeral 50 designates an aluminum wiring layer, and numeral 48 designates a window provided in an oxide insulator 49 for connecting the semiconductor to the aluminum wiring layer 50.

References E, B, and C respectively designate the emitter, base and collector electrodes, and $CR_1$ and $CR_2$ designate resistor electrodes of the variable resistor.

Figure 7:
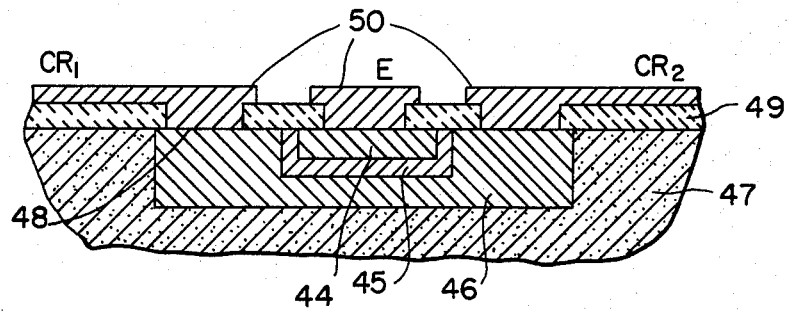
FIG. 7 is a sectional view taken on a line A—A' in FIG. 6.

FIG. 7 is a sectional view taken on the line A—A' in FIG. 6.

Next, explanation will be given on the operation principle according to FIG. 7.

In th present invention, the carrier density (impurity density) of the emitter region 44, in the same fashion as that of the usual bipolar transistor, is made far higher than that of base region 45; and the forward bias voltage is applied between the emitter and the base, so that minority carriers which are proportional to the emitter current are injected into the base region 45 located just below the emitter; the injected minority carriers diffusing mainly toward the lower collector-base junction, so that when the collector junction is at either a zero bias or a reverse bias, the carriers reach the collector region 46 through said junction. Now, if the distance, in the same fashion as that of the usual bipolar transistor, between the emitter-base junction located just below the emitter and the collector-base junction located just below the emitter-base junction, i.e., the so-called "base width", is kept sufficiently smaller than the minority carriers injected from the emitter region 44 toward the base region 45 scarcely disappear therein, and reach the collector region 46.

Thus, the carriers arriving at the collector region become the majority carriers in the collector region, thereby increasing the electrical conductivity of the collector region located just below the base-collector junction.

Here, the carrier density (impurity density) at the collector region formed of the epitaxial layer in the usual bipolar process, when sufficiently lowered, allows the electrical conductivity of the collector region located just below the base-collector junction to be almost proportional to the majority carriers coming from the emitter through the base, in other words, proportional to the emitter current.

As seen from the above, this invention aims at providing an electronically controlled variable resistor whose resistance value is inversely proportional to the control signal by allowing the electrical conductivity of the collector region located just below the base-collector junction to change in proportion to the emitter current, in other words, by allowing the resistance value of the same region to change in an inverse proportion relationship to the emitter current.

For this purpose, various parastic elements produced when in practical use as a variable resistor should be eliminated to the utmost.

FIG. 6 is a view of one embodiment of the pattern obtained in consideration of the above-noted parastic elements.

In detail, the undesirable parasitic elements in FIG. 6 includes electrodes $CR_1$ and $CR_2$ and a resistance region formed of the collector diffusion region 46 which is not covered by the base region 45, the resistance region being arranged in parallel to the variable resistance region formed of the collector region located just below the desirable base region.

The resistance region from the collector region located just below the base region to the electrodes $CR_1$ and $CR_2$, is also an undesirable parasitic element, which is arranged in series with the variable resistor region formed of the collector region located just below the desirable base region.

Now, some explanation will be given on a concrete means to avoid the influence of parasitic elements as much as possible. In detail, it is effective to design the pattern on which the parasitic resistive element in series decreases in its resistance value to the utmost, or to design the addition of a collector wall to make higher the carrier density (impurity density) at the peripheral collector region including the electrodes $CR_1$ and $CR_2$. It is also effective to reduce the effects of the parasitic resistive element by designing the pattern on which the collector region which is not covered by the base region to be as small as possible in width so as to increase its resistance value and its length.

The reason for providing a collector electrode C at the collector region separately from the resistor electrodes $CR_1$ and $CR_2$ is that the emitter current used for the control signal is removed through the collector electrodes $CR_1$ and $CR_2$, thereby not having an unfavorable effect on the control signal present upon the electrodes $CR_1$ and $CR_2$. Hence, it is desirable to dispose the electrode C symmetrically with respect to the electrodes $CR_1$ and $CR_2$ as shown.

Similarly to the above, it is of course desirable to dispose the base electrode B symmetrically with respect to the electrodes $CR_1$ and $CR_2$.

As seen from the above, this invention can employ the conventional bipolar IC process to provide with ease a variable resistor having a resistance value which is variable in an inverse proportion relationship with respect to the control signal. Hence, the invention is applicable to multiplication processes for various analog signals so as to thereby have an extremely large practical effect.

Furthermore, this invention is not limited to the above described embodiments, but can be modified in various ways within the scope of this invention.

We claim:

1. An electronically controlled variable semiconductor resistor comprising a semiconductor of a first conductivity type forming an emitter region having a high carrier density, a semiconductor of a second conductivity type which is opposite to said first conductivity type forming a base region adjoining said emitter region and having a lower carrier density than said emitter region, and a semiconductor of said first type of conductivity forming a collector region adjoining said base region, wherein said base region adjoining said emitter region is respectively expanded in a first direction on one side thereof and a second direction on another side thereof, said expanded base regions being respectively provided with two resistive electrodes for using said base region adjoining said emitter region as a resistor; and wherein said base region adjoining said emitter region is also expanded in a third direction at a different side thereof so as to have a high impedance, said expanded portion being provided with a base electrode for enabling the application of a forward bias to said base region and said emitter region; and wherein said emitter region and collector region are respectively provided with an emitter electrode and a collector electrode.

2. An electronically controlled variable semiconductor resistor according to claim 1, wherein the carrier density of said base region expanded at both sides of said base region adjoining said emitter region is made higher than the carrier density of said base region adjoining said emitter region.

3. An electronically controlled variable semiconductor resistor according to claim 1, wherein a forward bias is applied between said emitter electrode and said base electrode, and either a zero bias or a reverse bias is applied between said base electrode and said collector electrode, so that when said forward bias applied between the emitter and the base is changed, the conductivity of said base region adjoining said emitter region is varied, thereby making the magnitude of the resistance between said two resistive electrodes variable.

4. An electronically controlled variable semiconductor resistor according to claim 1, wherein a forward bias is applied between said emitter electrode and said base electrode, and either a zero bias or a reverse bias is applied between said base electrode and said collector electrode, and a local oscillator signal is superimposed on said forward bias applied between said emitter and said base, thereby changing the conductivity of said base region adjoining said emitter region in response to said local oscillator signal, and wherein a resistance constituted from said two resistive electrodes is used as a common emitter resistance for a differential amplifier having a base input which is supplied with an input signal so that the frequency of either a sum of or a difference between the frequency of said input signal and the frequency of said local oscillator signal is selectively output from a collector output of said differential amplifier, thereby consitituting a frequency mixer.

5. An electronically controlled variable semiconductor resistor comprising a semiconductor of a first conductivity type forming an emitter region of a high impurity carrier density, a semiconductor of a second conductivity type which is opposite to said first conductivity type forming a base region adjoining said emitter region and having a lower impurity carrier density than said emitter region, and a semiconductor of said second conductivity type forming a collector region adjoining said base region and having lower impurity carrier density than said emitter region, wherein a width of said base is made sufficiently small to allow minority carriers which are injected from said emitter region to said base region to reach said collector region almost without disappearaing; and wherein said collector region adjoining said base region is respectively expanded in a first direction on one side thereof and a second direction on another side thereof, said expanded collector regions being respectively provided with two resistive electrodes for using said collector region adjoining said base region as a resistor; and wherein said collector region adjoining said base region is also expanded in a third direction at a different side thereof, said expanded portion being provided with a collector electrode; and wherein said base region and emitter region are respectively provided with a base electrode and an emitter electrode.

6. An electronically controlled variable semiconductor resistor according to claim 5, wherein the impurity carrier density of said collector region which expanded at both sides thereof and adjoining said base region is made higher than the impurity carrier density of said collector region adjoining said base region.

7. An electronically controlled variable semiconductor resistor according to claim 5, wherein a forward bias is applied between said emitter electrode and said base electrode, and either a zero bias or a reverse bias is applied between said base electrode and said collector electrode, wherein when said forward bias applied between said emitter and said base is changed or an emitter current is changed, said carriers which are injected from said emitter region to said base region reach said collector region through said base region so as to vary the conductivity of said collector region adjoining said base region, thereby making the magnitude of the resistance between said two resistive electrodes variable.

* * * * *